United States Patent [19]

Beyersdorf

[11] 4,056,727
[45] Nov. 1, 1977

[54] ATTACHMENT MEANS OF AN OBJECT TO A SUPPORT

[75] Inventor: Hartwig Beyersdorf, Scharbeutz, Germany

[73] Assignee: GEBA, Gesellschaft fuer Brandmeldeanlagen mbH & Co., Neuss, Germany

[21] Appl. No.: 720,421

[22] Filed: Sept. 3, 1976

[30] Foreign Application Priority Data

Sept. 5, 1975 Germany ............................ 2539655
Sept. 5, 1975 Germany .............................. 281764

[51] Int. Cl.² .................................................. G01T 1/18
[52] U.S. Cl. ..................................... 250/385; 250/336
[58] Field of Search ..................... 250/384, 385, 336; 24/204, 221 K; 292/62; 340/237 S

[56] References Cited

U.S. PATENT DOCUMENTS

| 2,564,101 | 8/1951 | Dzus | 24/204 |
| 3,600,018 | 8/1971 | Dzus | 292/62 |
| 3,767,917 | 10/1973 | Lampart et al. | 250/384 |
| 3,898,716 | 8/1972 | Aylott | 24/221 K |
| 3,985,453 | 10/1976 | Nakano | 340/237 S |

Primary Examiner—Harold A. Dixon
Attorney, Agent, or Firm—Otto John Munz

[57] ABSTRACT

A shock-, vibrations- and tampering-proof attachment means of an object, such as a signal producing insert of an ionization alarm system coaxially and non-rotatably to a support, such as for land-, marine- and air vehicles provides a spring assembly with a spring and biased coaxial protrusion in the bottom of the object with a helically wound canal running through the protrusion having end orifices in its surface. The support is provided with a U-shaped fork fixed with its yoke in it. A connecting means equipped with a rod traverses the protrusion perpendicularly to its axis. The rod is fastened to both free ends of the yoke. Optimum shapes and dimensions of the respective parts are established, also with the view of maintaining a minimum size of the object itself. The object with the fixed protrusion is mounted by rotation thereof to the support, thus hiding the attachment means and making them vibration proof and inaccessible from the outside. An attempt to disassemble the attachment by re-rotation of the object relative to the support results only firstly in moving the point of engagement of the attachment upwardly toward the vertex of the canal, simultaneously distancing the protrusion from the spring assembly and subsequently reversing the axial motion of the protrusion toward the spring assembly with the point of engagement of the attachment continuing to move to the end of the canal or channel, thus preventing axial separation and a reverse rotation without excessive force. Inventive means of adapting the attachment means to a specific ionization fire alarm system are disclosed.

43 Claims, 5 Drawing Figures

ATTACHMENT MEANS OF AN OBJECT TO A SUPPORT

FIELD OF THE INVENTION

Attachment means specifically of an ionization alarm system to a shock-, vibrating- or tampering-prone fire alarm system.

DESCRIPTION OF THE PRIOR ART

Such means for attachment of a signal insert on to a base is known (U.S. Pat. No. 3,935,465 issued Jan. 27, 1976, for: An Ionization Analyzing Air Pollution, smoke and Fire Alarm Device, and U.S. Pat. No,. 3,963,929, issued June 15, 1976 for: Ionization Analyzing Air Pollution, Smoke and Fire Alarm Device, both by Hartwig Beyersdorf).

They deal with a protrusion in the shape of a plug, and a connecting element provided within the base having at least one spring which rests against the enlarged end of a related plug, conforms to the outer shape of the plug and can be interlocked with it. This solution has the advantage of a most simple mechanical structure, but is in some cases of usage insufficient for the secure attachment of the insert to the base, for instance where the attached object is subject to axial oscillation in the cse of boats, of machines or of buildings which are subject to vibration, or whenever a protection against unauthorized removal is necessary.

U.S. Pat. No. 2,564,101 discloses connecting devices for the fastening of an object to a support, which have a spring assembly, which can be fixed within the object, and which has a protrusion towards the support, and a connecting element attachable to the support. In the assembly the protrusion is held under directional spring tension away from the connecting element and is guided longitudinally so as to permit its abutment against a stop. In this device, the protrusion is provided with a channel the opening of which begins in the outside cylindrical surface of the protrusion at the free end of the protrusion, runs in an at least approximately helical line up to a vertex at a distance from the free end, and descends from there still maintaining the rotational sense of the helix, towards the free end, in a path that is axially shorter than the axial distance between the free end and the vertex, and the connecting element which is held in the support is adapted to reach radially into the channel. Furthermore, the end of the protrusion abutting against the stop within the spring assembly has a slot in the manner of a slotted head screw. The protrusion may be pushed axially against the spring tension with a screwdriver reaching through the open end of the spring assembly until it reaches into the fastening element of the support, and then can be turned, thereby effecting a bayonet catch between the protrusion and the fastening element. By this means of attachment simultaneously the outside of its movable part is accessible to a screwdriver, in order to make the connection or to disassemble it if necessary. A covered attachment therefore is impossible.

SUMMARY OF THE INVENTION

The primary object of the invention is to provide a secured connection means between an object such as a signal insert of an ionization fire alarm system, and a support coaxially fastened to it, which will survive high axial shock oscillations and vibrations, such as in engine driven vehicles, or unauthorized or accidental tampering therewith.

Another object of the invention is to provide a rotatable assembly of the object with the support.

Another object of the invention is to mount the means of attachment described, hidden covered between the object and the support inaccessibly eliminating a disengagement thereof.

Yet another object of the invention is to provide the means of attachment mentioned which avoid the necessity of axial motion between parts of the object and support and of using a tool such as a screwdriver for the assembly thereof.

Other objects and advantages of the invention will become obvious to those skilled in the art from the following description, claims and drawings.

BRIEF DESCRIPTION OF THE DRAWINGS

FIG. 2A is a partial cross-section of FIG. 2.

DESCRIPTION OF THE PREFERRED EMBODIMENT

Figure 1:
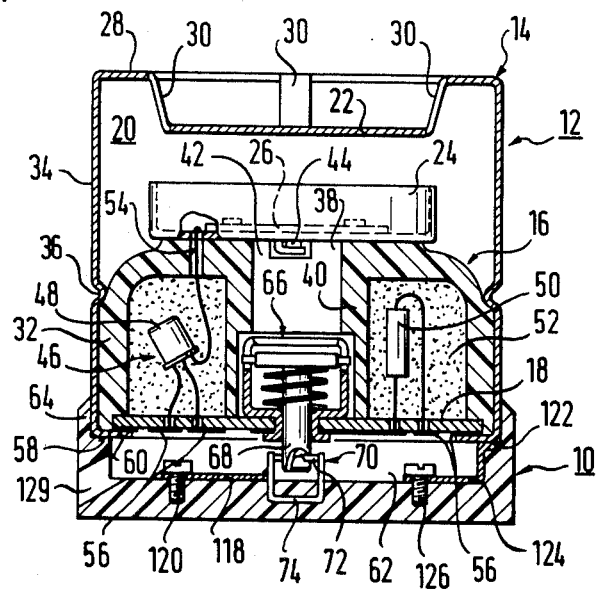
FIG. 1 is an axial cross-sectional view of an ionization fire alarm signal device whose signal insert is attached to a base.

In the device of the invention a proportion of the axial distance of the point of engagement of the connecting element fixed in the support from the point of stop to the distance between the free end of the protrusion from the point of stop, as measured when the protrusion abuts against the stop is provided to assure the engagement of the connecting element with the channel of the protrusion whenever the object touches the support surface. Axial motion of the protrusion by means of a screwdriver in order to achieve the connection is therefore not necessary.

In addition, the fact that the protrusion is fixed within the object so that it cannot be turned, permits turning of the protrusion in relation to the fastening element fixed in the support, by turning the entire object on the support. This is possible because the object is held in turntable contact with the supporting surface. It is, therefore, not necessary either to use a screwdriver in order to turn the protrusion in relation to the connecting element fastened in the support, and, as a consequence, the protrusion can be hidden in a position behind the object, and does not require access to it from the front. The size of the object remains practically the same because a single spring assembly is centrally located. When the connecting element fixed in the support is in engagement with that part of the canal of the protrusion which runs in a helical line, a turning of the object, and thereby of the protrusion, achieves the effect that the point of engagement moves up to the vertex while simultaneously the protrusion is pulled from the spring assembly, after which the axial motion of the protrusion is reversed towards the spring assembly while the point of engagement continues to move as far as the end of the canal, thereby effecting a bayonet catch which effectively prevents axial separation of object and support as well as unintentional reverse turn, because a reverse turn would require sufficient torque to pull the protrusion out of the spring assembly again. The signal insert 12 is provided with an outer metal housing 14, an insulator 16 retained within said housing, and a wiring plate 18 fastened to the insulator 16 on its rear surface, facing the base 10. A measuring chamber 20 is formed inside the housing 14, in which a plate-shaped outer electrode 22 and a center electrode 24 fastened to the outside of insulator 16, facing away from base 10 are mounted facing each other, and the measuring chamber is ionized by means of a radioactive source 26. The outside electrode 22 is axially spaced in a small distance from the annular front covering 28 by means of spacers 30, in such a way that, seen from the outside, it covers a circular cutout in the front covering 28, but so that the ambient air may enter the measuring chamber 20 between the front covering 28 and the outside electrode 22, practically unimpaired by the narrow spacers 30.

The cuplike insulator 16 which carries the center electrode 24, and which is open towards the base 10, has a cup-shaped outer wall 32, which is slipped into the tubular outer wall 34 of the metal housing 14, and is fixed therein. The axial position of insulator 16 and, therefore, the position of the center electrode 24 in relation to the outside electrode 22 is determined by a circular crimp 36 in the outside wall 34 of the metal housing 14. In the center of the outer wall 34 of insulator 16 is provided an opening 38, and from the rim of said opening 38, a tubular inner wall 40 of the insulator 16 reaches at least approximately to the level of the rim of the outside wall 32, facing the base, and surrounds an inner chamber 42. Part of the axial length of this inner chamber 42 serves as a reference ionization chamber, which is ionized by an additional radioactive source 44.

When smoke enters the masuring chamber 20, its resistance and thereby the ionization current flowing therein change. Thereby, the potential of the center electrode 24 changes, which can be used, in a manner known per se, to produce a fire alarm signal. For the utilization of the potention modifications of the center electrode 24, a signal transmitter circuit 46 is provided, which comprises a number of electrical circuit elements, such as a field effect transistor 48, and a resistor 40, and which the arranged in the annular space between outer wall 32 and inner wall 40 of the insulator 16. These circuit elements are imbedded in cast resin 52. The gate connection of the field effect transistor 48 which forms the input of the signal transmitter circuit 46, is led through a canal 54 in the outer wall 32 of the insulator 16, to the center electrode 24, with which it is connected, while the electrical connections between the electrical circuit elements 48, 50 of the signal transmitter circuit 46 are effected by conductors 56, shown in heavier print for the sake of clarity, which conductors are provided as a printed circuit on the wiring plate 18 on the rear side facing the base 10.

Base 10 is provided with an annular stationary supporting surface 58 for insert 12, which is seated on said supporting surface in a turnable manner. The housing 14 made of sheet metal is radially crimped towards the center to form an annular rim 60 on the rear of insert 12, which faces base 10, and which rests against the annular supporting surface 58. The crimping of the rim 60 takes place during the manufacture of the signal insert 12 after the introduction of the insulator 16, and the wiring plate 18 into the housing 14. The annular rim 60 abuts against the outer rim of the rear side of wiring plate 18, which faces base 10, thereby preventing axial motion of the wiring plate out of housing 14. The rim 60, when pressed with sufficient force against the rear side of the wiring plate 18, or bent into an opening provided in the wiring plate may be used in the prevention of a turning of the wiring plate 18 in relation to the housing 14 and the insulator 16.

The base or support 10 is further provided with an inner chamber 62 located axially behind the supporting surface 58, and with an axially protruding rim 64 which surrounds the supporting surface 58 and guides the axially rearmost portion of the cylindrical outside wall 34 of housing 14, and thereby the insert 12, in an axial directon, i.e., preventing a radial motion out of co-axial alignment with the base 10. The axial elevation of the rim 64 above the supporting surface 58 is less than the axial height of base 10 measured between its rear side facing away from insert 12 and the supporting surface 58, and the total height of base 10 is small compared to that of insert 12, so that the size of the entire alarm device is insiginificantly enlarged by the base 10. The positioning of the supporting surface 58 close to the outer circumference of the base 10 permits a relatively minor radial width of the supporting surface 58, so that it practically does not encroach upon the space of the inner chamber 62 of base 10.

To connect the insert and the base, a spring assembly 66 is provided, which carries a cylindrical pin-shaped protrusion 68, projecting from the center of the rear of insert 12, while within the base there is held a connecting element 70 in a non-turnable position.

The connecting element 70 comprises a rod 72 which traverses the protrusion 68 transversely to its axis, and which is slightly longer than the diameter of the protrusion 68, as well as of a U-shaped fork 74, which is cast into the base 10 with its yoke part, and to both free ends of which the rod 72 is fastened.

Figure 2:
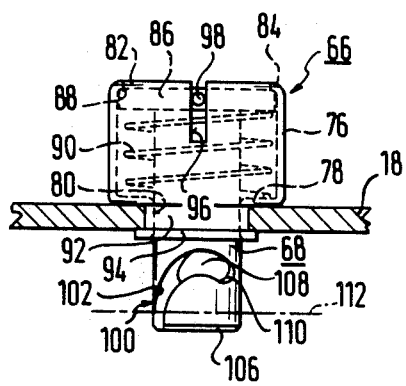
FIGS. 2 and 2A are an enlarged detail of the spring assembly on FIG. 1.
Figure 3:
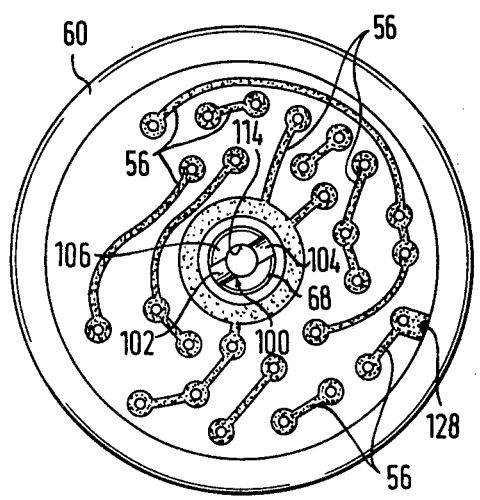
FIG. 3 is a rear view of the signal insert of the fire alarm device shown in FIG. 1.
Figure 2A:
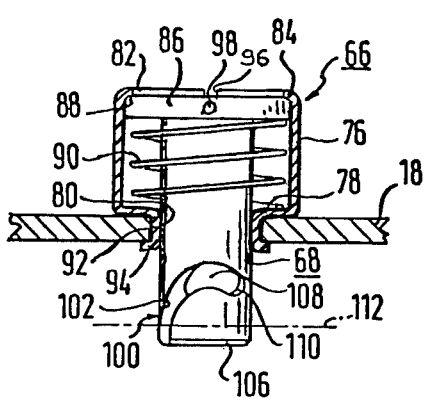

Spring assembly 66 and protrusion 68 are shown in greater detail on FIG. 2; a top view of the frontral surface of the protrusion 68 facing base 10 (FIG. 1) can be seen on FIG. 3. The spring assembly 66 is nearly cup-shaped with a cylindrical outside wall 76, and a bottom 78, which is located at the frontal surface of spring assembly 66 which faces base 10 (FIG. 1) and which abuts against the upper surface of the wiring plate 18, which faces away from the base 10. The bottom 78 is provided with a central aperture 80, through which extends the protrusion 68.

It is also possible to guide the protrusion inside the aperture 80 movably in a longitudinal direction. On its frontal side, facing away from the base 10 (FIG. 1), the spring assembly 66 is provided with an aperture 82 which is smaller than the inner diameter of its outside wall 76, which aperture is surrounded by a rim 84, crimped towards the center. The end of the protrusion 68, located inside the spring assembly 66, has an enlarged head 86, whose outside diameter corresponds to the inner diameter of the outside wall 76 of the spring assembly 66, and with which the protrusion 68 is guided within the spring assembly 66 in a longitudinally movable manner. The enlarged head 86 is adapted to abut against a stop which is formed by the inside 88 of the rim 84 of the spring assembly 66, which surrounds the aperture 82. On the side which faces away from the stop 88, the head 86 is surrounded by a helical spring 90 which exerts pressure in the direction of the stop 88; the other end of the helical spring 90 rests on the bottom 78 of the spring assembly 66.

A tubular collar 92, which coaxially surrounds the protrusion 68 and which traverses the wiring plate 18, extends in axial direction from the inner edge of central aperture 80 of the bottom 78 of the spring assembly 66. On the rear side of the wiring plate 18, facing the base 10, the collar is crmped towards the outside to form a ring 94, which clamps the inner rim of the wiring plate 18 to the bottom 78 of the spring assembly. Thereby, the spring assembly 66 and the wiring plate 18 are connected with each other in a non-turnable manner. The inner diameter of the collar 92 corresponds approximately to the outer diameter of that section of the protrusion 68 which traverses it, so that the protrusion is guided in a longitudinally movable manner along a greater axial distance than corresponds to the thickness of the bottom 78; this, together with the guidance by means of the head 86 results in a two-fold longitudinal guidance in the embodiment shown. In principle, a single longitudinal guidance would suffice, a double guidance, however, gives the advantage of greater accuracy and a more robust device.

Insert 68 must be held in a non-turnable position relative to the signal insert 12. In this embodiment, this is achieved in a simple way by guiding the protrusion 68 non-turnably within the spring assembly 66, which spring assembly itself, as mentioned before, is fastened to the wiring plate 18 in a rigid, non-turnable manner. The spring assembly 66 has two diametrically opposed axial slits 96 each radially receiving one radially extending cam 98 of the protrusion 68. These cams 98 are fixed on the outer rim of the head 86.

Aside from its head 86, the protrusion 68 is of basically cylindrical outer shape along its entire axial length. It is diametrically transversed by a canal 100. The canal 100 has openings 102, 104 (FIG. 3), which are located on opposite sides on the outside of the protrusion 68. These openings 102, 104, are axially symmetrical to each other. As can be seen from FIG. 3, the canal 100 opens into the frontal side of the free end 106 of the protrusion 68, which frontal side faces the base 10. As can be seen from the opening 102 in FIG. 2, this opening begins at the free end 106 of the protrusion 68, climbs at first at a steep and then at a decreasing angle in an approximately helical line up to a vertex 108 located at a distance from the free end 106, and finally returns to the end 110 of the canal 100 still maintaining the rotational direction of the helical line, in a path covering a smaller axial distance than that between the free end 106 and the vertex 108. When the signal insert 12 is separated from the base 10 (FIG. 1), the head 86 (FIG. 2) of the protrusion 68 under the effect of the helical spring 90 abuts against the stop 88. Now, in order to attach insert 12 to the base 10, the insert 12 is pushed into the base 10. Even though the protrusion 68 has been moved before as far as possible into the spring assembly 66, its length is sufficient that the rod 72 of the connecting element 70 provided in the base 10 can enter the opening of the canal 100, which begins at the free end 106.

A dash-and-dot line 112 in FIG. 2 indicates the point of catch of the rod 72 with the protrusion 68 and the spring assembly 66 when the ring 60 of the insert 12 abuts against the supporting surface 58. It is possible that at first the free end 106 of the protrusion 68 will meet the rod 72. By turning of the insert 12, however, it can be ascertained that the rod 72 actually can penetrate into the beginning of the opening of the canal 100 as far as to the point of catch 112. To this end, the axial distance between the point of catch 112 and the stop 88 is smaller than the distance measured between the free end 106 of the protrusion 68 from this stop 88, when the protrusion 68 abuts against this stop 88.

When the insert 12 is pushed into the base 10, the insert 12 should preferably be guided by the rim 64 of the base 10 already when the free end 106 of the protrusion 68 could possibly meet the rod 72. To this end, preferably the axial height of the rim 64 above the supporting surface 58 should be greater than the distance between the free end 106 of the protrusion 68 and the stop 88 when this protrusion 68 abuts against the stop 88, decreased by the axial distance measured in the same position between the surface of the insert 12 which is intended to abut against the support 58 of the base 10, i.e. the rear side of ring 60 which faces base 10, and stop 88. It is particularly important that the insert 12 be guided within the rim 64 while the rod 72 penetrates the opening of the canal 100, for which purpose the axial height of the rim 64 above the supporting surface 58 should be greater than the distance of the free end 106 of the protrusion 68 measured from the stop 88 in a position of abutment of the protrusion 68 against the stop 88, decreased by the axial distance of the point of catch 112 of the connecting element 70 from the stop 88. After the insert 12 has been pushed into the base 10 until the ring 60 abuts against the supporting surface 58 of the base 10 and the rod 72 has reached the point of catch 112 as indicated in FIG. 2, the insert 12 is rotated. In the embodiment, this rotation is clockwise, although, in principle, with an initial helical inclination of the canal 100 in the opposite direction, a fastening by counterclockwise rotation would also be possible. Because of the helical form of the canal 100, by the rotation of insert 12, and thereby of the protrusion 68, an axial relative movement between protrusion 68 and rod 72 is effected; indeed, because of the rigid attachment of the rod 72, the protrusion 68 is axially pulled out of the spring assembly 66. This movement continues until the rod 72 penetrates the canal 100 at the vertex 108. Subsequently, while the sense of rotation of the insert 12 is maintained, the protrusion moves under the influence of the helical spring 90, back into the spring assembly 66, until the rod 72, as shown in FIG. 1, penetrates the canal 100 at its end 110. Thus, a bayonet catch is achieved, because a reverse rotation of the insert is possible only by overcoming not only the friction forces, but also the tension of the helical spring 90, in order to pull the protrusion 68 from the spring assembly 66 until it reaches the vertex 108 once more.

As a modification of the embodiment shown, the canal 100 simply is a groove with a single opening in the cylindrical surface of the protrusion 68, and the connecting element 70 provided in the base 10 is fashioned as a pin, which catches this groove radially from the outside. Further two such grooves in axially-symmetrical position are provided into which a pin each locks radially, in other words, two openings 102, 104 are provided similar to the embodiment shown, but which do not have a diametrically transversing canal. During the manufacture of the canal 100 as a transversing canal as shown in the embodiment, it is practical, if, as can be seen from FIG. 3, a central bore 114 is made in the protrusion 68, starting at the free end 106 thereof, and then the two halves of the canal 100 are milled into the opposite side of the protrusion 68, each thereby forming an opening 102, 104.

In the embodiment, the outside diameter of the housing 14 of the insert 12 as well as the total height of the signal device is 35 mm each; FIG. 1 shows the signal device in approximately two-fold enlargement. It is sufficient in this case if the spring assembly 66 has a diameter of 9 mm, and an axial height above the wiring plate 18 of 6.5 mm, while the protrusion 68 has a diameter of 5.5 mm, and extends 7 mm beyond the reverse side of the wiring plate 18 in the direction of the base 10. It is evident that the size of the signal insert 12 is actually not affected. In addition, the frontal side of the spring assembly 66, facing away from the base 10, together with the head 86 of the protrusion 68, enclosed therein, replace a required inner electrode of the reference chamber, wired in series with the measuring chamber 68, which, in this manner, is provided inside the axial space of the inner chamber 42, which is located between the rear side of the center electrode 24, and the spring assembly 66, which is effective as part of the inner electrode. The spring assembly 66, therefore, does not increase the size of an ionization fire alarm device of familiar construction.

The embodiment shown has an additional advantage over a known ionization fire alarm device, in that the head 86 of the protrusion 68, which forms part of the inner electrode, is axially movable by means of which the effective distance between the center electrode 24, and the inner electrode, can be adjusted. When the insert 12 is fastened to the base 10, the required axial position of the head 86 can be effected by, for instance, inserting at least one washer or washers of varying thicknesses between the ring 60 of the insert 12 and the supporting surface 58 of the base 10. A wide insulating distance between the center electrode 24 and the inner electrode is provided by the fact, that the inner dimensions of the inner wall 40 of the insulator 16 in the axial space, which contains the spring assembly 66, are greater than the outer diameter of the spring assembly so that the inner wall 40 surrounds the spring assembly 66 without touching it.

In order to ascertain that, whenever the protrusion 68 is pulled from the spring assembly 66, the forces needed to overcome the spring resistance can be transferred through the inner rim of the wiring plate to the rim 60, and the supporting surface 58, without bending the wiring plate 18, said wiring plate 18 should not only be fastened to the outside wall 32, but it also should be fixed to the rear end of the inner wall 40 of the insulator 16. This can be achieved by glueing for example. Additionally, a close mechanical connection between the insulator 16 and the wiring plate 18 is achieved by the casting compound 52 inside the annular space between inner wall 40 and outer wall 32 which compound is filled in through an opening (not shown) in the wiring plate 18 or in the outer wall 32 only after the wiring plate 18 has been applied to the rear side of the insulator 16. It is also possible, if necessary, to provide the rear end of the inner wall 14 of the insulator 16 with plug-shaped protrusions which extend through openings, which are not shown, in the wiring plate 18, and which are heat-molded to form heads resting against the rear side of the wiring plate facing the base 10. At the same time, the aforementioned steps ascertain that the rotational forces exerted by the protrusion 68 can be transferred to the insert 12 without damage to the wiring plate 18.

The electrical connection between the signal insert 12 and the base 10 is achieved by two pairs of contacts, one of which being formed by the protrusion 68 and the connecting element 70 provided in the base 10; the yoke 74 of the connecting element 70 is connected to a contact screw 120 by means of a metal strip 118. The second pair of contacts is formed by the rim 60 of the housing 14 and a contact 122 located within the supporting surface 58 of the base 10 and thereby being part of the supporting surface 58, and which is also connected to a contact screw 126 by means of a connection lug 124. If so desired, the contact 122 may be resilient in the axial direction. It preferably connects the entire electrically conductive housing 14 to ground or mass potential. If, as in an above mentioned case, a washer should be inserted between the annular rim 16 and the supporting surface 58, this washer should be made of electrically conductive material, or else have a cutout at the position of contact 122, so that it will not hinder the current flow between rim 60 and contact 122. Insofar as the signal transmitter circuit 46 needs a ground or mass connection like the housing 14, this connection can be provided by soldering to the rim 60 a conductor 56, onto which the rim 60 is bent, at a soldering point 128. A cable which is connected to the contact screws 120, 126 can be led into the base 10 through an opening 129.

Figure 4:
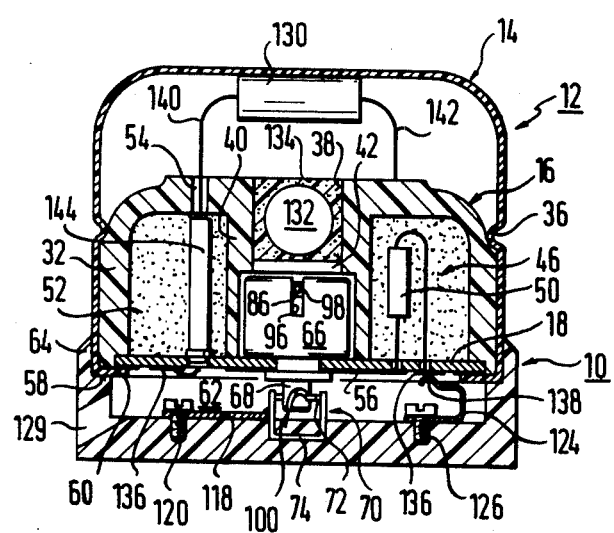
FIG. 4 is an axial section through a temperature alarm device, whose signal insert, according to the invention, is fastened to a base.

FIG. 4 shows, in another embodiment, the use of the means of attachment in a heat signal device. Identical or similar parts as shown in FIGS. 1 to 3 are identified by identical reference numbers. The mechanical structure of the signal insert 12 and of the base 10 are closely similar to the aforementioned embodiment, and the connection by means of the spring assembly 66 and the protrusion 68 on the one hand, and the connecting element 70 on the other hand, is identical.

The heat signal device according to FIG. 4 consists of an efficiently heat-conducting, however electrically non-conductive housing 14 made of plastic which cups the insulator 16 at some distance on the side facing away from the base 10, a resistor 130, having a resistance value varying in response to the ambient temperature, and mounted in thermal contact with the inside of the housing 14 as well as a similar, however thermally insulated resistor 132 electrically connected in series with resistor 130. The thermally insulated resistor 132 is located inside the axial space of the inner chamber 42, which is not occupied by the spring assembly 66. Already by this location, the air which is trapped between housing 14 and the insulator 16, and which heats up but slowly, in turn protects the resistor 132 from heating up too quickly, so that very little else is necessary to effect thermal insulation. Preferably, to further this effect, the thermally insulated resistor 132 can be held inside the inner chamber 42 by a thermally insulating adhesive or cast resin layer 134 which surrounds resistor 132, and simultaneously serves as a means of attachment. It is further preferable to manufacture the insulator 16 from thermally insulating material. Because the axial height of the insulator 16 is approximately equal to the sum of the axial heights of the spring assembly 66, and the thermally insulated resistor 132, the axial height of construction is small. The use of an insulator 16 identical to that of the embodiment shown in FIG. 1 to 3 permits a multi-purpose use of this insulator.

The alarm signal circuit 46, electrically connected to the connecting point between the resistor 130 and the thermally insulated resistor 132 may have a different electrical structure than in the aforementioned embodiment, but again it is located in the annular space between inner wall 40 and outer wall 32 of the insulator 16, and the electric conductors 56 provided on the reverse side of the wiring plate 18 may have a different pattern from the aforementioned embodiment. Again, one pair of contacts is formed by the protrusion 68 and the connecting element 70 provided in the base 10. Since the housing 14 is electrically non-conductive, the second pair of contacts consists of a conductor 136 and a contact 138 resiliently resting against that conductor. In order to permit a position of the insert 12 which is turned by an angle of 180° in relation to the position of the insert 12 to the base 10 as shown in the drawing, the conductor 136 may extend in a semi-circle or a circle around the axis of the signal insert 12. A particular position of the insert 12 may be enforced by the use of coded pins or other such enforcement means.

Of the connecting wires 140, 142 of the resistor 130, connecting wire 140 is guided, in a direction parallel to the axis, from the outside of the insulator 16, facing away from the base 10, through a channel 54 provided in its outer wall 32, through the space between inner wall 40 and outer wall 32 of the insulator 16, and through an opening in the wiring plate 18 to its reverse side, facing the base 10, and is soldered there to the conductor 136. Since the soldering can take place only after the resistor 130 has been connected to the housing 14, and the insulator 16 as well as the wiring plate 18 with the signal circuit 46 have been introduced into the housing 14, it is useful for the passage of the connecting wire 140 through the annular space between inner wall 40 and outer wall 32 of the insulator 16, and through the opening in the wiring plate 18, if, as in the embodiment, the connecting wire 140 is surrounded on approximately its entire length between the outer wall 32 of insulator 16 and wiring plate 18 by a sleeve 144, which is fastened at one of its ends, and serves as a guide for the connecting wire 140. In the embodiment, the sleeve 144 is held in the wiring plate 18. The same measure, which is not shown, may be provided for the connecting wire 142. The connecting wires of the thermally insulated resistor 132, which are not shown, may either be brought through the inner wall 40 of the insulator 16 towards the wiring plate 18, or else might be led to the outside of the insulator 16, facing away from the base 10, and then may be guided from there in a similar manner as the connecting wire 140, axially parallel to the rear side of the wiring plate 18.

What is claimed is:

1. A shock-, vibrations-, and tampering-proof attachment means of an object, such as a signal producing insert of an ionization alarm system coaxially along a common central axis to a fixed support face of a support, such as of land-, marine- and air-vehicles,
    A. said object comprising:
        A 1. an elongated protrusion mounted non-rotatably and coaxially in the bottom of said object and protruding through its bottom downwardly facing said support face;
        A 2. a spring assembly mounted coaxially within the bottom of said object;
        A 3. a helical crescent shaped channel with openings within the protruding bottom of said protrusion said channel continuing with a vertex directed upwardly and from there to its end;
    B. said support provided with a connector means for a rod, said connector means fixed non-rotatably coaxially with said protrusion; said connector means protruding upwardly from said support
        A 4. said protrusion mounted with said spring assembly under upward axial tension away from the said connector means;
    C. a rod mounted between the said connector means and reaching into said protrusion to engage said channel in a direction substantially radial to the common axis to permit assembly of said object with said support by rotation of the former relative to the latter, to prevent their separation by accident or design.

2. An attachment means as claimed in claim 1, in that the protrusion is provided with a cylindrical surface, at least in its portion which projects from the spring assembly.

3. An attachment means as claimed in claim 1, the canal transversing the protrusion about diametrically.

4. An attachment means as claimed in claim 1, the rod extending through the canal transversely to the axial direction of the protrusion and being fastened at both of its ends outside said protrusion.

5. An attachment means as claimed in claim 1, characterized in that the connecting element, held in the support being provided with a U-shaped fork held by its yoke part in the support, the rod being attached to both free ends of said fork.

6. An attachment means as claimed in claim 1, the object having an approximately cylindrical outline, the supporting surface being located close to the outer circumferences of the object.

7. An attachment means as claimed in claim 1, the bottom of the spring assembly having a central aperture, the protrusion mounted to traverse the central aperture of the bottom of the spring assembly facing the support.

8. An attachment means as claimed in claim 1, the supporting surface being approximately circular.

9. An attachment means as claimed in claim 8, the support face having a rim, the axial height of the rim above the supporting face being smaller than the axial height of the base between its rear surface, facing away from the object, and the supporting face.

10. An attachment means as claimed in claim 1,
    said spring assembly comprising an axial helical spring and an upper stop, the protrusion being mounted within said spring and pushed by it upwardly against the stop away from the connecting element;
    the axial distance of the path between the openings within the protruding bottom of said protrusion from the vertex being greater than that from the vertex to the end of said channel;
    the axial distance between the point of engagement of said rod with said channel, or point of catch of the connecting element held in the support, and the stop being smaller than the distance between the free end of the protrusion and the stop in the position of abutment of the protrusion against the stop.

11. An attachment means as claimed in claim 10, the stop being formed by an inner side of the spring assembly positioned at its end facing away from the base.

12. An attachment means as claimed in claim 11, the spring assembly, on its frontal side, facing away from the base being provided with an aperture smaller than its inner diameter, the stop being formed by the inner side of the rim which surrounds the aperture.

13. An attachment means as claimed in claim 10, the end of the protrusion being located inside the spring assembly and provided with an enlarged head-abutment against the stop, and being biased under tension in the direction towards the stop by means of a helical spring, coaxialy surrounding it on the side facing away from the stop.

14. An attachment means as claimed in claim 13, the protrusion being guided within the spring assembly by means of the head.

15. An attachment means as claimed in claim 13, the outer surfaces facing the center electrode of the rim surrounding the aperture of the spring assembly and the head serving as the inner electrode.

16. An attachment means as claimed in claim 15, at least one washer being inserted between the insert and the supporting surface.

17. An attachment means as claimed in claim 16, the insert being provided with an efficiently heat-conducting housing cupping the insulator on the side facing away from the base at a distance, a temperature-sensitive resistor mounted to the inside of the housing in thermal contact with it, and another analogous, but thermally insulated resistor, the thermally insulated resistor being located within the axial portion of the inner chamber which is not occupied by the spring assembly.

18. An attachment means as claimed in claim 17, the thermally insulated resistor being held in the inner chamber by means of a surrounding layer.

19. An attachment means as claimed in claim 18, the insulator comprising thermally insulating material.

20. An attachment means as claimed in claim 17, the axial height of the insulator approximately equal to the sum of the axial heights of the spring assembly and the thermally insulated resistor.

21. An attachment means as claimed in claim 1, the support being a base.

22. An attachment means as claimed in claim 21, the base being of low axial height in relation to the object.

23. An attachment means as claimed in claim 21, the object being a signal insert, coaxially fastened to the base, forming, together with the base a fire alarm device.

24. An attachment means as claimed in claim 23, further comprising at least two pairs of electrical contacts between the insert and the base, one of them preferably being made by the protrusion and the connecting element.

25. An attachment means as claimed in claim 24, further comprising a second pair of contacts made by an annular contact at the insert, located opposite from the supporting surface of the base, and a contact located within the supporting surface in the base.

26. An attachment means as claimed in claim 25, the annular rim of the housing providing the annular contact.

27. An attachment means as claimed in claim 23, the insert comprising a housing, bent inwards radially to form an annular rim on the rear side, facing the base.

28. An attachment means as claimed in claim 27, the annular rim of the housing abutting against the outside rim of the rear surface of the plate facing the base.

29. An attachment means as claimed in claim 1, the support being provided with an outer rim for axial guiding of the object in its motion perpendicular to the base, the supporting surface being radially located therein.

30. An attachment means as claimed in claim 29, the axial height of the rim above the supporting face being greater than the distance measured from the free end of the protrusion to the stop in the position of abutment of the protrusion against the stop, decreased by the axial distance of the point of engagement of the connecting element held in the base from the stop.

31. An attachment means as claimed in claim 30, said axial height being greater than the distance measured from the free end of the protrusion to the stop in the position of abutment of the protrusion against the stop, decreased by the axial distance from the stop, measured in the same position, of the surface provided for abutting against the supporting surface of the object.

32. An attachment means as claimed in claim 29, and the signal insert comprising an insulator with a cup-shaped outer wall open towards the base, a central aperture of the outer wall and an inner wall surrounding an inner chamber, which reaches from the rim of this aperture at least approximately as far as the level of the rim of the outer wall facing the base, the spring assembly located inside the inner chamber.

33. An attachment means as claimed in claim 32, inner said insert provided with a measuring chamber and a reference chamber, each being located within the signal insert and ionized by at least one radioactive source;

the measuring chamber, being accessible to the ambient air and located on that side of the insulator which faces away from the base;

a central electrode, common to both chambers being located on the insulator, covering the aperture in its outer wall;

the reference chamber being formed by the inner chamber of the insulator and comprising an inner electrode, spaced from the central electrode, and the spring assembly being formed as at least a part of the inner electrode.

34. An attachment means as claimed in claim 33, the inside dimensions of the inner wall of the insulator in the axial portions occupied by the spring assembly being larger than the outer diameter of the spring assembly.

35. An attachment means as claimed in claim 34, at least one connecting wire of an electric circuit element provided within the housing extending parallel to the axis of the housing, from the outside of the insulator, facing away from the base, through a canal provided in the outer wall of the insulator, through the space between the inner wall and the outer wall of the insulator and through an aperture in the wiring plate to the rear surface of said plate, facing the base, the connecting wire being there connected with an electrical conductor provided in this location, and that the connecting wire being covered by a sleeve along nearly its entire length between the outer wall of the insulator and the wiring plate, the sleeve being held stationary at one of its ends.

36. An attachment means as claimed in claim 35, the sleeve being held in the wiring plate.

37. An attachment means as claimed in claim 35, further comprising a housing of said insert, the optimum proportions of the parts being at a ratio of the outside diamter of the housing to the total height of the signal device being equal, preferably about 35 mm each;

the spring assembly having a diameter of about 9 mm respectively, and the axial height above the wiring plate about 6.5 mm;

the protrusion having a diameter of about 5.5 mm and extending beyond the reverse side of the wiring plate in the direction of the base about 7 mm.

38. An attachment means as claimed in claim 1, the protrusion being guided within the spring assembly in a non-turnable manner, and the spring assembly being held in a non-turnable position in the object.

39. An attachment means as claimed in claim 38, the spring assembly being provided with at least one axially extending slot and the protrusion with a cam, said slot and said cam mounted to lock radially.

40. An attachment means as claimed in claim 39, the cam projecting from the outer circumference of the head.

41. An attachment means as claimed in claim 38, the object being provided with an outer housing, and on its rear side with a plate connected with the housing in a non-turnable manner, the spring assembly being mounted on a surface of the plate on the side facing away from the base non-turnably.

42. An attachment means as claimed in claim 41, the plate being fastened to the end of the inner wall of the insulator, facing the base.

43. An attachment means as claimed in claim 41, the bottom of the spring assembly facing the support having a collar mounted transversely to the plate and coaxially surrounding the protrusion, and bent outwardly into a ring on the rear side of the plate, which faces the support.

* * * * *